United States Patent

Penunuri

Patent Number: 5,334,960
Date of Patent: Aug. 2, 1994

[54] CONJUGATELY MATCHED ACOUSTIC WAVE TRANSDUCERS AND METHOD

[75] Inventor: David Penunuri, Fountain Hills, Ariz.

[73] Assignee: Motorola, Inc., Schaumburg, Ill.

[21] Appl. No.: 17,891

[22] Filed: Feb. 16, 1993

[51] Int. Cl.$^5$ .............................................. H03H 9/64
[52] U.S. Cl. .................... 333/193; 333/195; 310/313 R; 310/313 D
[58] Field of Search ............ 333/193, 194, 195, 196; 310/313 R, 313 B, 313 C, 313 D

[56] References Cited

U.S. PATENT DOCUMENTS

| | | | |
|---|---|---|---|
| 4,159,435 | 6/1979 | Lewis | 310/313 |
| 4,468,642 | 8/1984 | Hikita | 333/193 |
| 4,492,940 | 1/1985 | Hikita | 333/194 |
| 4,728,912 | 3/1988 | Yuhara et al. | 333/193 |
| 4,906,885 | 3/1990 | Kojima et al. | 310/313 B |
| 5,087,901 | 2/1992 | Kurosawa et al. | 333/193 |

FOREIGN PATENT DOCUMENTS

| | | |
|---|---|---|
| 0004752 | 1/1977 | Japan . |
| 0063919 | 4/1982 | Japan . |
| 0849448 | 7/1981 | U.S.S.R. . |

OTHER PUBLICATIONS

An article entitled "Propagation and Amplification of Rayleigh Waves and Piezoelectric Leaky Surface Waves in LiNbO3", K. Yananouchi et al., Journal of Applied Physics vol. 43, No. 3, Mar. 1972, pp. 856–862.
An article entitled "Sh-type and Rayleigh-Type Surface Waves on Rotated Y-Cut LiTaO3" K. Nakamura et al., 1977 IEEE Ultrasonics Symposium Proceedings, pp. 819–822.

Primary Examiner—Benny Lee
Assistant Examiner—Darius Gambino
Attorney, Agent, or Firm—Frederick M. Fliegel

[57] ABSTRACT

A filter device comprises an acoustic wave propagating substrate having an effective coupling coefficient $k^2$ and having a first filter and a second filter disposed on the acoustic wave propagating substrate. The first filter comprises a first electro-acoustic transducer and a first acousto-electric transducer, both disposed on the acoustic wave propagating substrate. The first acousto-electric transducer comprises $N_1$ many electrode pairs, wherein $N_1 \geq C/k^2$. C is a constant having a value in the range from 1 to 2. The first acousto-electric transducer is acoustically coupled to the first electro-acoustic transducer. The second filter comprises a second electro-acoustic transducer and a second acousto-electric transducer, both disposed on the acoustic wave propagating substrate. The second electro-acoustic transducer is electrically coupled to the first acousto-electric transducer. The second electro-acoustic transducer comprises $N_2$ many electrode pairs, wherein $N_2 < C/k^2$. The second acousto-electric transducer is acoustically coupled to the second electro-acoustic transducer.

17 Claims, 7 Drawing Sheets

CONJUGATELY MATCHED ACOUSTIC WAVE TRANSDUCERS AND METHOD

CROSS-REFERENCE TO RELATED APPLICATIONS

This application is related to two co-pending U.S. patent application Ser. No. 07/844,333, filed on Mar. 2 1992 and Ser. No. 07/793,925, filed on Nov. 18 1991, which are both assigned to the same assignee as the present application.

FIELD OF THE INVENTION

This invention relates in general to the field of acoustic wave filters, in particular to surface-acoustic- and leaky-wave filters and more particularly to acoustic wave filters employing cascaded transducers.

BACKGROUND OF THE INVENTION

There is an ongoing need for component miniaturization in radio wave communication devices. For example, smaller and more efficient components are needed for light-weight, hand-portable cellular telephones, wireless local area networks for linking computer systems within office buildings in a readily reconfigurable fashion, wristwatch- and credit-card-sized paging apparatus and other devices for promoting rapid, efficient and flexible voice and data communication.

Filters are needed for a variety of such communications applications wherein small size, light weight and high performance are simultaneously required. Increasing numbers of products seek to employ fixed spectral resources, often to achieve tasks not previously envisioned. Examples include cellular telephones, inter- and intra-facility computer-computer and/or computer-ancillary equipment linkages as well as a host of other, increasingly complex inter-personal and/or -equipment information sharing requirements. The desire to render increasingly complicated communications nodes portable and even hand-held and/or -portable and/or pocket-sized places extreme demands on filtering technology in the context of increasingly crowded radio frequency resources.

Acoustic wave filters provide filters meeting stringent performance requirements which are (i) extremely robust, (ii) readily mass produced, (iii) adjustment-free over the life of the unit and which (iv) sharply increase the performance to size ratio achievable in the frequency range extending from a few tens of MegaHertz to about several GigaHertz. However, need for low passband insertion loss simultaneously coupled with demand for high shape factor and high stopband attenuation pose filter design and performance requirements not easily met by a single acoustic wave filter alone.

One approach to satisfying these needs and demands is to cascade two or more acoustic wave filters. This approach realizes increased stopband signal rejection but requires additional matching components (e.g., inductors and/or capacitors) and also multiplies the volume and weight of the acoustic wave filters by the number of such filters cascaded. Matching components additionally incur major size and weight penalties because each transducer generally requires at least two matching components, each of which is at least as large as an acoustic wave filter die.

Another approach is to provide two or more such filters on a single substrate, wherein the filters are designed to have purely real impedances matched one to another without requiring intervening matching components. An example of such an approach is described in "Band Pass Filter Device", M. Hikita, U.S. Pat. No. 4,468,642 (Aug. 28, 1984), which is incorporated herein by reference. This approach has the advantages of improved performance, reduced size, weight and parts count and also provides improved manufacturability, coupled with greater ease of use. This approach has a first disadvantage of requiring the acoustic wave filter designer to restrict transducer impedances to a limited set of values in accordance with a rule:

$$N \simeq C/k^2, \quad (1)$$

where N represents the number of effective finger pairs in the acoustic wave transducer. C is a constant given the value 1.5 in the prior art and the electromechanical coupling coefficient $k^2$ is a material constant describing the acoustic wave substrate employed. A second disadvantage is that the two transducers must be substantially the same and must have substantially the same transfer function. Transducers designed in accordance with this rule have equal, purely real impedances at center frequency. Thus, transducers designed in accordance with this principle do not require additional matching components in order to be cascaded absent impedance mismatch loss penalties.

The prior art has addressed the insertion loss component of acoustic wave filter design through a number of approaches. These approaches include employing uni-directional transducers and also an arrangement wherein a number of input and output transducers are alternately disposed along an acoustic path to form a filter. The latter approach is described in some detail in "Surface Acoustic Wave Filter, Method and Apparatus", D. Allen, U.S. patent application No. 793,925 (filed Nov. 18, 1991) and also in "Acoustic Surface-Wave Bandpass Filter", M. Hikita, U.S. Pat. No. 4,492,940 (Jan. 8, 1985), which are hereby incorporated by reference.

The former approach is sometimes realized as a pair of unidirectional transducers coupled to an input, for example, on either side of a weighted, bidirectional transducer which is coupled to an output, for example. Both approaches are able to provide excellent in-band insertion loss characteristics and good shape factors. The disadvantage common to both approaches is that the stopband suppression is inadequate for many applications.

Thus, what are needed are practical, economical methods for, and apparatus employing, cascaded acoustic wave filters not requiring discrete matching components therebetween.

SUMMARY OF THE INVENTION

Accordingly, there is provided a new and improved filter device including (a) an acoustic wave propagating substrate having an effective coupling coefficient $k^2$, (b) a first filter and (c) a second filter. The first filter comprises (b1) a first electro-acoustic transducer and (b2) a first acousto-electric transducer, both disposed on the acoustic wave propagating substrate. The first acousto-electric transducer has a first electrical admittance $Y_1 = G_1 + jX_1$, wherein $G_1$ is a first real conductance and $X_1$ is a first imaginary conductance. The first imaginary conductance $X_1$ has a negative value over at least a first frequency range. The first acousto-electric transducer is acoustically coupled to the first electro-acoustic transducer. The second filter comprises (c1) a second acousto-electric transducer and (c2) a second electro-acoustic transducer, both disposed on the acoustic wave propagating substrate. The second electro-acoustic transducer is electrically coupled to the first acousto-electric transducer. The second electro-acoustic transducer has a second electrical admittance $Y_2 = G_2 + jX_2$, wherein $G_2$ is a second real conductance and $X_2$ is a second imaginary conductance. The second imaginary conductance $X_2$ has a positive value over at least the first frequency range. The second electro-acoustic transducer is acoustically coupled to the second acousto-electric transducer. The first and the second electrical admittances substantially obey a relation:

$$|Y_2^* - Y_1|/|Y_2^* + Y_1| < \delta,$$

wherein $\delta$ is a parameter describing admittance mismatch between the first acousto-electric transducer and the second electro-acoustic transducer.

The filter device desirably but not essentially includes the first acousto-electric transducer having a first electrical admittance $Y_1 = G_1 + jX_1$, wherein $G_1$ is a first real conductance and $X_1$ is a first imaginary conductance. The first imaginary conductance $X_1$ desirably has a negative value over at least a first frequency range. The second electro-acoustic transducer desirably has a second electrical admittance $Y_2 = G_2 + jX_2$, wherein $G_2$ is a second real conductance and $X_2$ is a second imaginary conductance. The second imaginary conductance $X_2$ desirably has a positive value over at least the first frequency range, wherein the first and second real conductances $G_1$ and $G_2$ are approximately equal over the first frequency range and wherein magnitudes of the first and second imaginary conductances $X_1$ and $X_2$ are desirably approximately equal over the first frequency range.

In a preferred embodiment, the apparatus comprises a filter device. The filter device includes in combination (a) an acoustic wave propagating substrate having an effective coupling coefficient $k^2$, (b) a first filter and (c) a second filter. The first filter includes (b1) a first electro-acoustic transducer disposed on the acoustic wave propagating substrate and (b2) a first acousto-electric transducer disposed on the acoustic wave propagating substrate. The first acousto-electric transducer has $N_1$ many electrode pairs therein, wherein $N_1 \geq C/k^2$ and C is a constant having a value in the range from 1 to 2 (for unweighted transducers). The first acousto-electric transducer is acoustically coupled to the first electro-acoustic transducer. The second filter includes (c1) a second acousto-electric transducer disposed on the acoustic wave propagating substrate and (c2) a second electro-acoustic transducer disposed on the acoustic wave propagating substrate. The second electro-acoustic transducer is electrically coupled to the first acousto-electric transducer. The second electro-acoustic transducer has $N_2$ many electrode pairs therein, wherein $N_2 < N_1$. The second electro-acoustic transducer is acoustically coupled to the second acousto-electric transducer.

The filter device desirably but not essentially includes $N_2 < C/k^2$.

A filter is desirably realized including in combination a substrate for propagating acoustic waves and a first electro-acoustic transducer disposed on the substrate. The first electro-acoustic transducer generates acoustic waves in response to an electrical signal applied to the first electro-acoustic transducer. The filter further includes a first inductive acoustic transducer disposed on the substrate. The first inductive acoustic transducer is acoustically coupled to the first electro-acoustic transducer. The first inductive acoustic transducer has a first electrical admittance $Y_1 = G_1 + jX_1$, wherein $G_1$ is a first real conductance and $X_1$ is a first imaginary conductance. The first imaginary conductance $X_1$ has a negative value over at least a first frequency range. The filter further includes a first capacitive acoustic transducer disposed on the substrate. The first capacitive acoustic transducer is electrically coupled to the first inductive acoustic transducer. The first capacitive acoustic transducer has a second electrical admittance $Y_2 = G_2 + jX_2$, wherein $G_2$ is a second real conductance and $X_2$ is a second imaginary conductance. The second imaginary conductance $X_2$ has a positive value over at least the first frequency range. The filter further includes a first acousto-electric transducer disposed on the substrate. The first acousto-electric transducer is acoustically coupled to the first capacitive acoustic transducer. The first acousto-electric transducer generates an electrical signal in response to an acoustic wave applied to the first acousto-electric transducer. The first and second real conductances $G_1$ and $G_2$ are approximately equal over the first frequency range. The magnitudes of the first and second imaginary conductances $X_1$ and $X_2$ are approximately equal over the first frequency range.

The present invention further provides a method for forming a filter. The method comprises steps of (a) providing an acoustic wave propagating substrate having an effective coupling coefficient $k^2$, (b) disposing a first electro-acoustic transducer on the acoustic wave propagating substrate and (c) disposing a first acousto-electric transducer on the acoustic wave propagating substrate. The first acousto-electric transducer has $N_1$ many electrode pairs therein, wherein $N_1 \geq C/k^2$ and C is a constant having a value in the range from 1 to 2. The first acousto-electric transducer is acoustically coupled to the first electro-acoustic transducer. The method further comprises steps of (d) disposing a second acousto-electric transducer on the acoustic wave propagating substrate and (e) disposing a second electro-acoustic transducer on the acoustic wave propagating substrate. The second electro-acoustic transducer is electrically coupled and conjugately impedance matched to the first acousto-electric transducer. The second electro-acoustic transducer has $N_2$ many electrode pairs therein, wherein $N_2 < N_1$. The second electro-acoustic transducer is acoustically coupled to the second acousto-electric transducer.

The method desirably but not essentially further includes steps of disposing a first acousto-electric transducer having length $M_1$ on the acoustic wave propagating substrate and a further step of disposing a second electro-acoustic transducer having length $M_2$ on the acoustic wave propagating substrate. $M_2$ is greater than $M_1$.

The method desirably but not essentially includes a step of disposing a second electro-acoustic transducer having $N_2$ many electrode pairs on the acoustic wave propagating substrate. $N_2$ is less than $C/k^2$.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

DETAILED DESCRIPTION OF THE DRAWING

Figure 1:
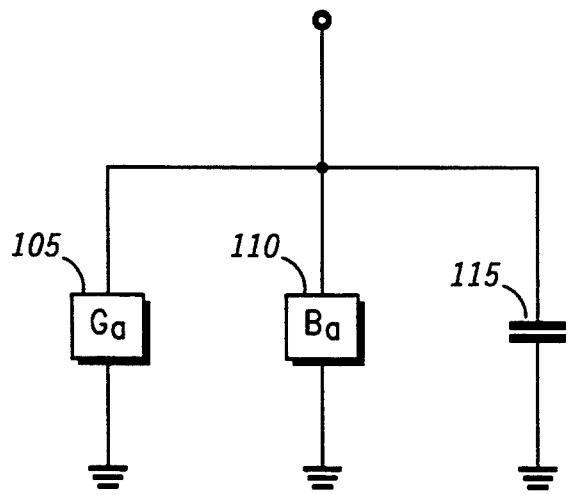
FIG. 1 is a simplified schematic diagram of a model for an acoustic transducer in accordance with the prior art.

A broad variety of different acoustic wave types have application in microwave acoustic devices for frequency selection. These include surface acoustic waves (SAWs), also known as Rayleigh waves; surface skimming bulk acoustic waves (SSBWS or SSBAWs); pseudo surface waves or leaky surface waves; shallow bulk acoustic waves (SBAWs); surface transverse waves (STWs); Stonely, Sezawa, Love and other plate and higher order acoustic guided waves; longitudinal and shear bulk acoustic waves (BAWs); and leaky waves and the like. For convenience of explanation, the present invention is described in terms of SAWs, with the understanding that other varieties of acoustic propagation are also applicable, including but not limited to those noted above.

The terms "surface acoustic wave", "acoustic wave" and "surface wave" or "SAW" are employed interchangeably herein to stand for any suitable type of acoustic wave propagation. The terms "substrate material", "substrate" and "acoustic wave propagating substrate" are employed interchangeably herein to stand for any substrate that supports propagation of acoustic waves. The terms "reflection element" and "reflection electrode" are employed interchangeably herein to stand for reflection elements comprising electrodes. Further, the terms "comb electrode", "finger electrode", "finger", "interdigitated electrode" and "transducer electrode" are employed interchangeably herein to stand for acoustic wave transducer and/or reflector elements comprising electrodes.

"Band Pass Filter Device", M. Hikita, U.S. Pat. No. 4,468,642, (Aug. 28, 1984), which is hereby incorporated herein by reference, describes improved acoustic filter selectivity obtained without excessive insertion loss and without requiring additional external matching elements. This is achieved by cascading two individual acoustic filters co-located on a single substrate, providing roughly double the stop-band suppression associated with either acoustic filter alone. An electrical connection is made between two acoustic transducers $N_C$ acoustic wavelengths long, wherein $N_c$ equals $1.5/k^2$ as noted in Eq. (1) (supra), providing equal, real-valued transducer electrical impedances.

The two acoustic transducers have little or no electrical impedance mismatch and so no mismatch loss external matching elements are required. However, the transducers must be identical or nearly so in order for this approach to be employed. This is disadvantageous in some applications because the product of the individual transducer transfer functions is merely the square of either individual transfer function. In general, it is often desirable to design cascaded transducers to place nulls of one transfer function at frequencies not corresponding to nulls of the other transducer's transfer function because the product of the two transducer's transfer functions then provides more stopband suppression than provided by the square of either transducer's transfer function alone.

The most general condition for maximum power transfer (and hence reduced insertion loss) from a source having output impedance $Z_S = R_S + jX_S$ to a load having input impedance $Z_L = R_L + jX_L$ is obtained when:

$$Z_S = Z_L^* \tag{2}$$

wherein the asterisk (*) denotes conjugation of a complex number. Eq. (2) may alternatively be written as $$R_S = R_L \tag{3}$$

and $$X_S = -X_L. \tag{4}$$

The condition described by Eq. (1) is thus a special case of that described in Eqs. (2) through (4) wherein $X_S = X_L = 0$.

Applicant has discovered that a more general impedance match is possible by designing one transducer to have an electrical impedance such as $Z_{T1} = R_{T1} + jX_{T1}$, wherein $X_{T1}$ is negative over at least a first frequency range and the other transducer is designed to have an electrical impedance such as $Z_{T2} = R_{T2} + jX_{T2}$, wherein $X_{T2}$ is positive over at least the first frequency range and has magnitude similar to $X_{T1}$ and wherein further $R_{T1}$ and $R_{T2}$ have similar magnitudes over at least the first frequency range.

Detailed numerical simulations were carried out in the near field region using a proprietary computer program incorporating well-known second order effects such as acoustic reflections, triple transit effects, acoustic propagation loss and the well-known element factor as well as electrical parasitic effects such as stray capacitance, finite metallization resistance and so forth. These effects are described, for example, in *Surface Wave Filters: Design, Construction, and Use*, edited by H Matthews, Wiley-Interscience, 605 Third Ave., New York, N.Y. (1977), or in *Studies In Electrical And Electronic Engineering* 19: *Surface-Wave Devices for Signal Processing*, edited by D. Morgan, Elsevier Science Publishers B. V., Molenwerf 1, P.O. Box 211, 1000 E. Amsterdam, The Netherlands (1985).

Applicant has discovered that leaky waves as well as other acoustic propagation modes sharing the properties of very high (>5%) electromechanical coupling and leaky wave propagation are well suited for use in devices according to the present invention. Leaky waves and related waves, for example, wave propagation on 41° Y-rotated X-propagating lithium niobate, 36° Y-rotated lithium tantalate or 64° Y-rotated X-propagating lithium niobate, are described in "Acoustic Wave Devices Employing Surface Skimming Bulk Waves", M. F. Lewis, U.S. Pat. No. 4,159,435 (Jun. 26, 1979), in an article entitled "Propagation and Amplification of Rayleigh Waves and Piezoelectric Leaky Surface Waves in LiNbO$_3$", K. Yamanouchi et al., appearing in Journal of Applied Physics Vol. 43, No. 3, March, 1972, pp. 856–862, and in an article entitled "SH-type and Rayleigh-Type Surface Waves on Rotated Y-Cut LiTaO$_3$", K. Nakamura et al., 1977 IEEE Ultrasonics Symposium Proceedings, pp. 819–822, which articles and patents are incorporated herein by reference.

These studies prove that transducer pairs having impedances in accordance with Eqs. (2) through (4) may be realized.

These simulations and empirical measurements also show that constant C (Eq. (1)) may usefully fall in the range from 1 to 2, is desirably in the range from 1.1 to 1.7 and preferably is about 1.25 when the transducers are of the unweighted type. The constant C depends on the weighting type and function used for weighted transducers. For apodized transducers, N may be estimated as being proportional to the integral of the weighting function divided by the integral of an unweighted transducer of comparable length or by other techniques for counting the effective number of sources, for example.

An approximate analysis based on a model discussed in text associated with FIG. 1 and Eqs. (5) through (7) (infra), illustrates the principles and identifies values of approximations to transducer characteristics (e.g., beamwidth and number of acoustic periods in length) having these properties. These values serve as starting points for more accurate simulations for deriving design values in accordance with Eqs. (5) through (9), infra.

FIG. 1 is a simplified schematic diagram of an electrical model for an acoustic transducer in accordance with the prior art. The model represents the acoustic transducer admittance as having three principal components, radiation conductance 105 ($G_a$), Hilbert susceptance 110 ($B_a$) and static capacitance $C_T$ represented as capacitor 115.

This model provides frequency dependence of transducer (unweighted type) admittance $Y_T$ as:

$$Y_T = G_a[\sin(\chi)/\chi]^2 + j\{G_a\{(-\sin(2\chi)-2\chi)/2\chi^2\} + \omega C_T\}, \quad (5)$$

where j represents the positive square root of $-1$, $\omega$ represents radian frequency ($2\pi f$) and normalized frequency argument $\chi$ is equal to $N\pi(f-f_o)/f_o$, wherein $f_o$ represents the nominal transducer center frequency and N represents the number of finger pairs (or the transducer length) along the direction of acoustic wave propagation in acoustic wavelengths, which measures are equivalent for the simple case of an unweighted transducer comprising one-fourth of an acoustic wavelength wide electrodes and interelectrode gaps. Various relationships allow N to be estimated for a variety of particular transducer designs as is well known to those of skill in the relevant arts. Hilbert susceptance 110 ($B_a$) is approximately equal to $G_a\{(\sin(2\chi)-2\chi)/2\chi^2\}$ (Eq. (5)).

Examination of Eq. (5) allows several immediate deductions, viz., the frequency at which an impedance match occurs must always be greater than the nominal center frequency $f_o$. This is true because the largest component of Hilbert susceptance 110 ($B_a$) can only contribute a negative reactive component large enough to dominate the $\chi C_T$ term at frequencies above nominal center frequency $f_o$. Hence the center frequency for the cascaded transducer pair (and so the frequency defining the passband center) will be shifted upward from nominal transducer center frequency $f_o$ by an amount determined by frequency dependencies of the cascaded transducer's admittances. This frequency shift is described herein as relative frequency shift and is expressed as a percentage of nominal center frequency $f_o$.

A second deduction apparent from inspection of Eq. (5) is that at nominal transducer center frequency for impedance mismatch must exist because the value of the function $G_a\{(\sin(2\chi)-2\chi)/2\chi^2\}$, which function must be non-zero in order to compensate the $\omega C_T$ term, is zero at nominal transducer center frequency $f_o$.

Radiation conductance $G_a$ is:

$$G_a = 8Nk^2 f_o C_T, \quad (6)$$

while static capacitance $C_T$ is:

$$C_T = \epsilon_o \epsilon_r A N, \quad (7)$$

where A represents aperture width or acoustic beamwidth and $\epsilon_r$ and $\epsilon_o$ represent relative dielectric constant and permittivity of free space, respectively.

Applicant has discovered that when frequency argument $\chi$ is sufficiently large, the function $G_a\{(-\sin(2\chi)-2\chi)/2\chi^2\}$ becomes negative over a limited frequency range above nominal center frequency $f_o$. Applicant has further discovered that when radiation conductance $G_a$ is sufficiently large, susceptance due to $C_T$ becomes compensated and transducer admittance $Y_T$ becomes inductive (i.e., has a negative imaginary admittance component). Two transducers having different transducer admittances, one having a positive imaginary component over the limited frequency range and one having a negative imaginary component (of similar magnitude to the positive imaginary component) over the same limited frequency range, may thus be coupled together to cancel the imaginary components over the limited frequency range and thus to provide a purely real effective impedance between the two transducers without requiring additional (external) components. The imaginary admittance components of the first and second transducers are conveniently adjusted by adjusting the lengths N of the individual transducers, for example.

Applicant has additionally discovered that a further improvement in impedance matching of the two transducers may be realized by tailoring the real portions of the admittances of the first and second D transducers. One convenient technique for realizing such tailoring is effected through making the beamwidths (e.g., $A_1$, $A_2$, FIG. 3, infra) different, for example. This provides yet further improvements in impedance matching between the two transducers. These improvements provide the advantages of reduced insertion loss, etc., without requiring additional matching components.

As a first example, consider the case of 128° Y-rotated, X-propagating lithium niobate, for which the material constants are well known. Many such materials constants are given in Air Force Cambridge Research Laboratories Report AFCRL-TR-73-0597, entitled *Microwave Acoustics Handbook: Volume 1A. Surface Wave Velocities*, by A. Slobodnik et al. and related volumes which are available from NTIS and/or DTIC, among other places.

Figure 2:
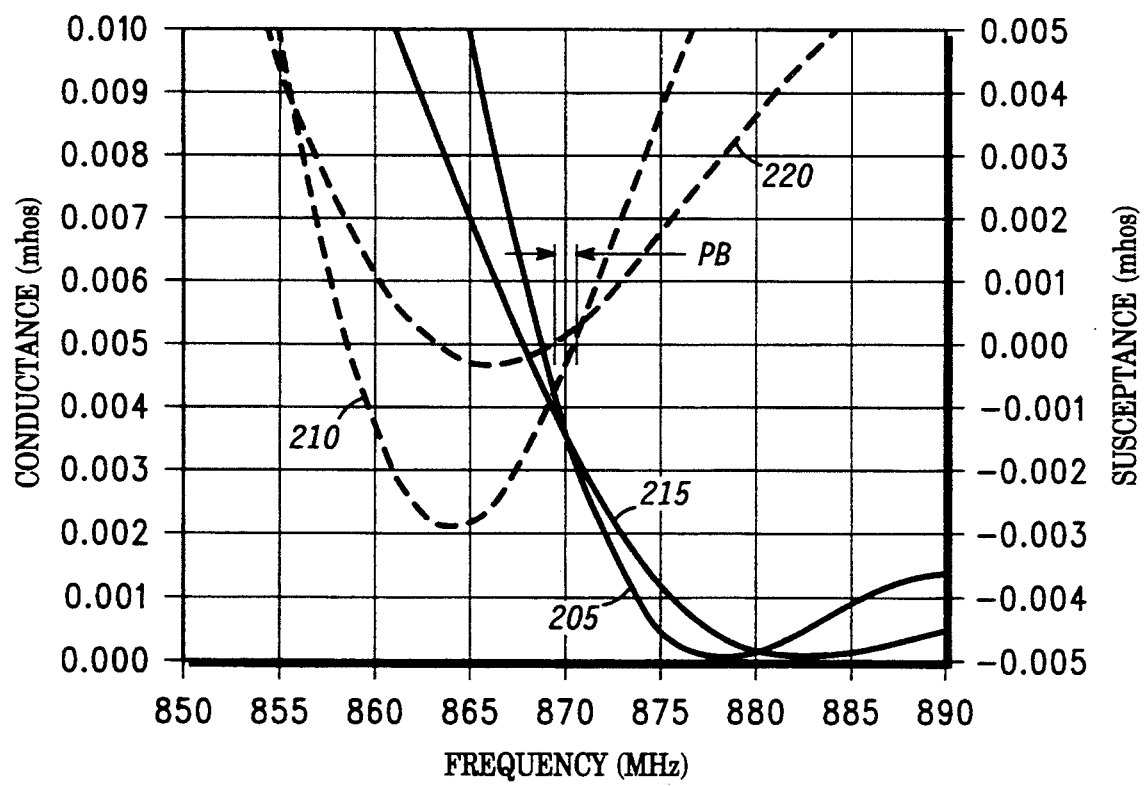
FIG. 2 is a graph of simulated admittance values versus frequency for two transducers in accordance with the present invention.

A numerical search using Eq. (5) and design parameters transducer length/number of finger pairs N and acoustic beamwidth or aperture A indicates that optimum impedance match occurs for a pair of SAW transducers B and C as shown in Table I below. FIG. 2 is a graph of simulated admittance values versus frequency for two transducers in accordance with the present invention. The vertical axis of FIG. 2 is calibrated in mhos (0 to 0.01, left axis, corresponding to solid traces 205, 215; −0.005 to 0.005, right axis, corresponding to dashed traces 210, 220) while the abscissa is calibrated in MegaHertz (850 to 890 MHz). FIG. 2 illustrates simulated real (solid lines 205 (C) and 215 (B)) and imaginary (dashed lines 210 (C) and 220 (B)) admittance components for transducers B and C of Table I over a narrow band of frequencies about nominal transducer center frequency $f_o$.

| Transducer | N | A |
|---|---|---|
| B | 26 | 35.5 |
| C | 30 | 50 |

Table I. Design parameters for a pair of transducers B and C on 128° Y-rotated, X-propagating lithium niobate having conjugately matched impedances in accordance with the present invention.

As may be seen from inspection of data illustrated in FIG. 2, magnitudes of real admittance components 205, 215 (solid traces) are approximately equal at frequencies near 870 MegaHertz and magnitudes of imaginary components 210, 220 (dashed traces) are similar but of opposite sign at about 870 MegaHertz.

Modifying conditions of Eqs. (2) through (4) in accordance with:

$$|Z_S - Z_L^*|/|Z_S + Z_L^*| < \delta, \quad (8)$$

wherein $$\delta = 10^{-RL/20} \quad (9)$$

and RL represents return loss in deciBells (dB), provides ranges over which realizable mismatch losses are obtained and yet benefits resulting from conditions identified in the above-noted equations are preserved. The strict equalities given in Eqs. (2) through (4) become approximations providing ranges of admittance values over which filter and/or transducer performance is maintained within a desired set of bounds when mismatch conditions of Eqs. (8) and (9) are applied thereto.

The techniques described hereinabove may be applied to reduce impedance mismatch $\delta$ to arbitrarily small values. For general purpose filters, impedance mismatch $\delta$ is desirably in a range of less than $10^{-1}$ and preferably is in a range of less than $3 \times 10^{-2}$. Similarly, return loss RL is desirably in a range of less than −20 dB and preferably in a range of less than −30 dB. High performance filters may require impedance mismatch $\delta$ to be less than $10^{-2}$ and correspondingly may require return loss RL to be less than −40 dB. Impedance mismatch $\delta$ may be related to source/load impedance ratio X as $$\delta = [(1-X)/(1+X)], \quad (10)$$

while insertion loss IL is related to impedance mismatch $\delta$ by $$IL = 10 \log_{10}\{1 - \delta^2\}. \quad (11)$$

$\delta = 0.33$ provides insertion loss IL = 0.5 dB, representing one useful compromise between insertion loss IL, impedance mismatch $\delta$ and manufacturing tolerances.

Applicant has discovered that application of Eqs. (8) and (9) to Eqs. (2) through (4) provides a plethora of transducer designs, as partially exemplified by device configurations, simulations and measured data described in Table II and FIGS. 3 through 9 (infra).

For a first example, specifying a return loss RL of −20 dB corresponds to the range marked "PB" in FIG. 2 and corresponds to a bandwidth of about 4 MHz.

For example, specifying RL ≤ −40 dB (i.e., $\delta \leq 10^{-2}$) and performing simulations for coupling coefficient values of $k^2 = 5\%$, 10% and 15% provided a series of transducer parameters tabulated in Table II below.

While Table II provides specific values for transducer beamwidths, only the ratio between, and not the specific beamwidth values for, the inductive transducer beamwidth and the capacitive transducer beamwidth need be preserved in order to maintain specific impedance matching conditions of Table II in accordance with Eqs. (2) through (4), (8) and (9).

Also tabulated in Table II are relative frequency shifts, describing (in percentages) degrees to which passband center frequency exceeds nominal transducer center frequency $f_o$. As noted in text associated with Eq. (5) (supra), this always corresponds to upward frequency shifts.

| $k^2$ Coupling Coeff. | $(N_1, A_1)$ Inductive Transducer | $(N_2, A_2)$ Capacitive Transducer | Relative Frequency Shift (%) | $\delta$ Impedance Mismatch |
|---|---|---|---|---|
| 5% | (30, 50) | (26, 35.5) | 2.37 | $1.4 \times 10^{-3}$ |
| | (30, 50) | (22, 35.5) | 2.26 | $9.6 \times 10^{-3}$ |
| | (30, 41.5) | (25, 50) | 1.31 | $6.3 \times 10^{-3}$ |
| | (29, 41.5) | (23, 50) | 1.54 | $7.1 \times 10^{-3}$ |
| | (30, 50) | (21, 41.5) | 2.14 | $6.4 \times 10^{-3}$ |
| 10% | (17, 31) | (10, 50) | 2.85 | $9.6 \times 10^{-3}$ |
| | (16, 35.5) | (11, 50) | 2.85 | $2.6 \times 10^{-3}$ |
| | (16, 41.5) | (14, 50) | 2.02 | $9.0 \times 10^{-3}$ |
| | (15, 41.5) | (11, 50) | 3.33 | $2.7 \times 10^{-3}$ |
| | (15, 41.5) | (12, 50) | 2.85 | $9.5 \times 10^{-3}$ |
| 15% | (13, 50) | (5, 25) | 6.18 | $5.7 \times 10^{-3}$ |
| | (12, 50) | (6, 27.5) | 6.30 | $8.4 \times 10^{-3}$ |
| | (10, 41.5) | (8, 50) | 4.50 | $2.7 \times 10^{-3}$ |
| | (11, 35.5) | (7, 50) | 4.47 | $6.5 \times 10^{-3}$ |
| | (11, 35.5) | (8, 50) | 3.65 | $7.8 \times 10^{-3}$ |

Table II. Number of finger pairs N and aperture width A in acoustic wavelengths at center frequency together with relative frequency shift in percent and estimated impedance mismatch $\delta$ for conjugately matched inductive and capacitive transducers in accordance with the present invention.

Figure 3:
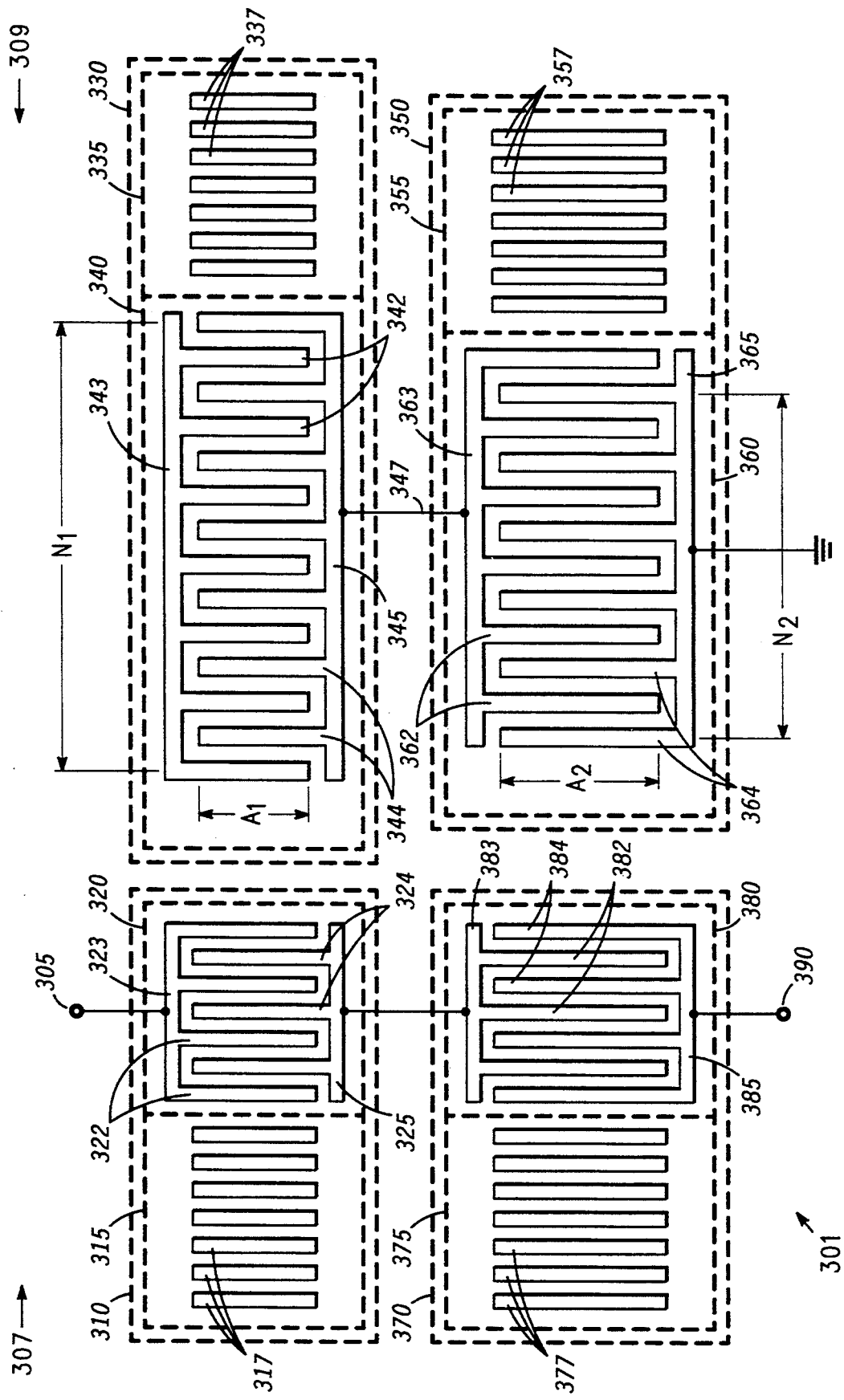
FIG. 3 is a simplified plan view of a portion of an acoustic wave filter in accordance with the present invention.

FIG. 3 is a simplified plan view of portion 301 of an acoustic wave filter in accordance with the present invention. Portion 301 comprises input 305 coupled to transducer 310. Transducer 310 desirably but not essentially includes acoustic reflector 315, comprising reflector elements 317. Transducer 310 further comprises transducer structure 320, including first electrodes 322 coupled to bus bar 323 and second electrodes 324 interleaved with first electrodes 322 and coupled to bus bar 325. Bus bar 323 is desirably coupled to input 305 and bus bar 325 is desirably coupled to ground, for example. Alternatively, bus bar 323 may be coupled to one side of a balanced signal source while bus bar 325 is coupled to another side of the balanced signal source, as is well known to those of skill in the arts to which the present invention pertains.

Signals having an appropriate frequency applied to input 305 result in acoustic waves propagating in directions 307 and 309 from transducer structure 320. Absent acoustic reflector 315, one-half of the acoustic energy propagates in direction 309 and is lost, providing 3 dB of insertion loss. Such an arrangement is called a "bidirectional" transducer because acoustic waves are principally emitted in two directions.

In the presence of acoustic reflector 315, acoustic energy traveling in direction 309 is reflected thereby and essentially all acoustic energy transduced by transducer structure 320 propagates in direction 307. This is referred to as a "unidirectional" transducer and provides improved filter efficiency (reduced insertion loss). Many techniques for realizing unidirectional transducer are known in the art (e.g., group-type, reflector type (as shown, FIG. 3), three-phase, etc.) and may be employed to realize any or some transducers in filters in accordance with the present invention.

Acoustic energy propagating to the right (direction 307) from transducer 310 is incident upon transducer 330.

Transducer 330 desirably but not essentially includes acoustic reflector 335, comprising reflector elements 337. Transducer 330 further comprises inductive transducer 340, including first electrodes 342 coupled to bus bar 343 and second electrodes 344 interleaved with first electrodes 342 and coupled to bus bar 345. Bus bar 343 is desirably coupled to ground, for example. Transducer 330 has beamwidth $A_1$ and length $N_1$, chosen to provide an inductive admittance characteristic measured across bus bars 343 and 345 in at least a first frequency interval. Beamwidth $A_1$ and length $N_1$ are also chosen to provide a first real portion of admittance characteristic $G_a$ over at least the first frequency interval in accordance with Eq. 5.

Transducer 350 desirably but not essentially includes acoustic reflector 355, comprising reflector elements 357. Transducer 350 further comprises capacitive transducer 360, including first electrodes 362 coupled to bus bar 363 and second electrodes 364 interleaved with first electrodes 362 and coupled to bus bar 365. Bus bar 363 is desirably coupled to bus bar 345 of inductive transducer 340 via interconnection 347 and bus bar 365 is desirably coupled to ground, for example. Alternatively, bus bars 363 and 345 may be coupled together and, similarly, bus bars 365 and 343, or bus bars 363 and 343 may be coupled together and, similarly, bus bars 365 and 345.

Electrical energy manifested by transducer 330 in response to incident acoustic energy having an appropriate frequency is coupled to transducer 350, causing acoustic energy to be emitted from transducer 350 in a fashion similar to that described hereinabove with reference to transducer 310, but with acoustic energy propagating to the left (i.e., in direction 309).

Capacitive transducer 360 has beamwidth $A_2$ and length $N_2$, chosen to provide a capacitive admittance characteristic measured across bus bars 363 and 365 at least the first frequency interval, wherein the capacitive admittance of capacitive transducer 360 approximately equals the inductive admittance of inductive transducer 340 in magnitude in accordance with Eqs. (8) and (9). Beamwidth $A_2$ and length $N_2$ are also chosen to provide a second real portion of admittance over at least the first frequency interval, wherein the second real admittance portion is approximately equal to the first real admittance portion in accordance with Eqs. (8) and (9).

The process of coupling electrical energy from transducer 330 to transducer 350 and the efficiency thereof is discussed in detail with reference to Eqs. (2) through (9), supra.

Acoustic energy traveling to the left (i.e., in direction 309) from transducer 350 is incident upon transducer 370.

Transducer 370 desirably but not essentially includes acoustic reflector 375, comprising reflector elements 377. Transducer 370 further comprises transducer structure 380, including first electrodes 382 coupled to bus bar 383 and second electrodes 384 interleaved with first electrodes 382 and coupled to bus bar 385. Bus bar 385 is desirably coupled to output 390 and bus bar 383 is desirably coupled to ground, for example.

Transducer 370 manifests electrical signals on bus bar 385 in response to incident acoustic signals of appropriate frequency. Input signals present at input 305 thus travel through and are filtered by each of transducers 310, 330, 350 and 370 in turn to provide output electrical signals at output 390.

Transducers 310 and 370 may each have independent ground connections or one or both may have balanced signals coupled thereto as is well known in the relevant arts.

Figure 4:
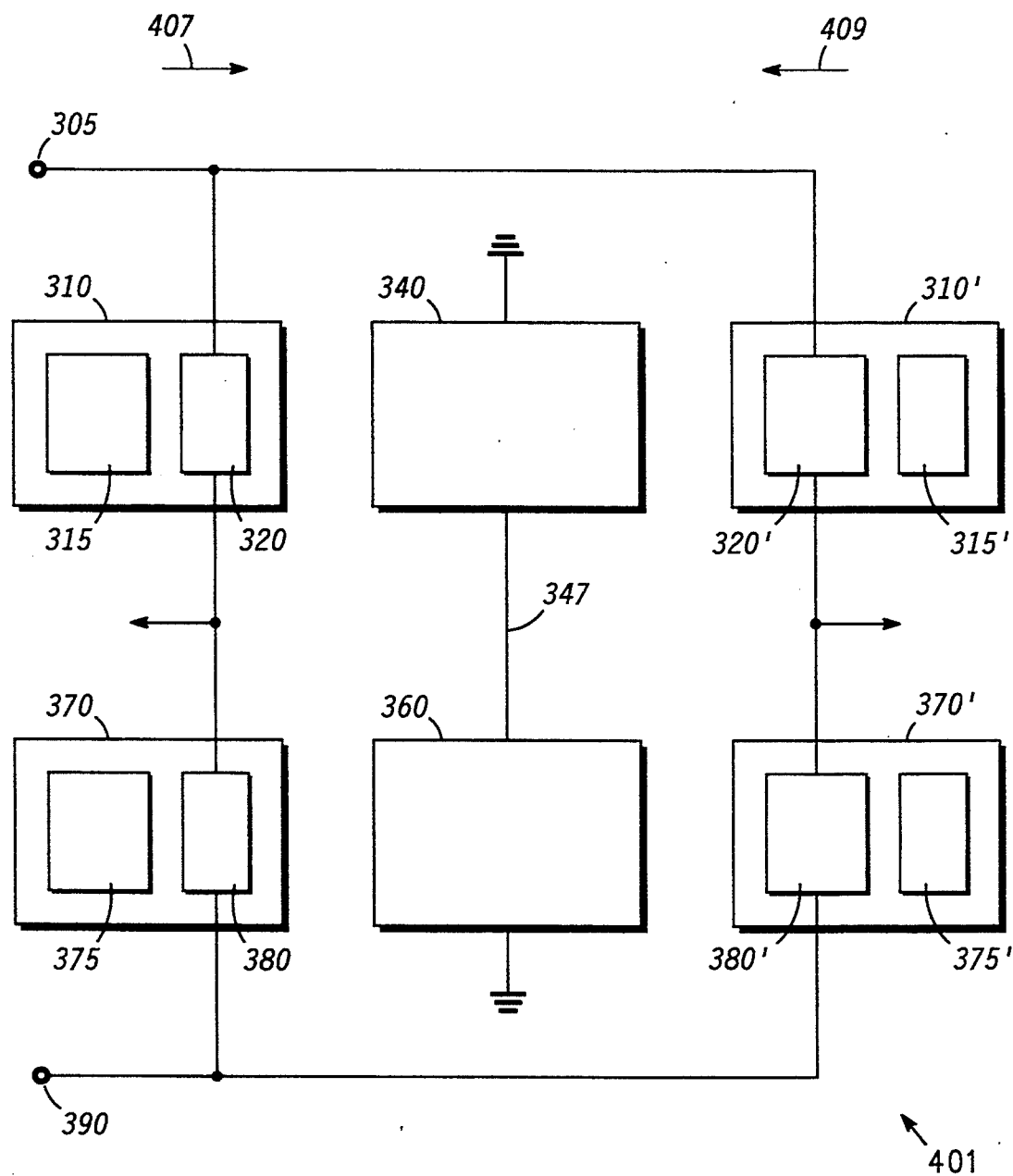
FIG. 4 is a simplified block diagram of an acoustic wave filter in accordance with a first preferred embodiment of the present invention.

FIG. 4 is a simplified block diagram of acoustic wave filter 401 in accordance with a first preferred embodiment of the present invention. Acoustic wave filter 401 comprises transducers 310 and 310' coupled to input 305 and having inductive transducer 340 disposed therebetween, transducers 370 and 370' coupled to output 390 and having capacitive transducer 360 disposed therebetween, wherein transducers 310 and 370 are analogous to transducers 310 and 370 of FIG. 3 and transducers 310' and 370' are similar to mirror images of transducers 310 and 370.

Transducer 310 comprises transducer structure 320 and desirably includes acoustic reflector 315, while transducer 310' comprises transducer structure 320' and desirably includes acoustic reflector 315'. Transducer 370 comprises transducer structure 380 and desirably includes acoustic reflector 375, while transducer 370' comprises transducer structure 380' and desirably includes acoustic reflector 375'. Inductive transducer 340 is electrically coupled to capacitive transducer 360, for example by link 347 and ground connections as shown in FIG. 4.

In practice, electrical signals applied to input 305 result in acoustic signals propagating in direction 407 from transducer 310 and in direction 409 from transducer 310'. These acoustic signals are incident on inductive transducer 340, giving rise to electrical signals which are coupled to capacitive transducer 360. Capacitive transducer 360 emits acoustic signals in directions 407 and 409, which acoustic signals are incident on transducers 370′ and 370, respectively. Transducers 370′ and 370 manifest electrical signals when so insonified, which electrical signals are coupled to output 390.

One reason that this arrangement may be preferred to that of FIG. 3 is that it is difficult to apply weighting or arbitrary frequency selectivity to unidirectional transducers. The arrangement of FIG. 4 allows inductive transducer 340 and/or capacitive transducer 360 to be weighted.

The arrangement of FIG. 4 allows additional frequency selectivity to be realized through apodization, withdrawal weighting and/or the like applied to inductive transducer 340 and/or capacitive transducer 360 while input or output transducers 310, 310′, 370 and 370′ are optimized to reduce passband insertion loss.

Figure 5:
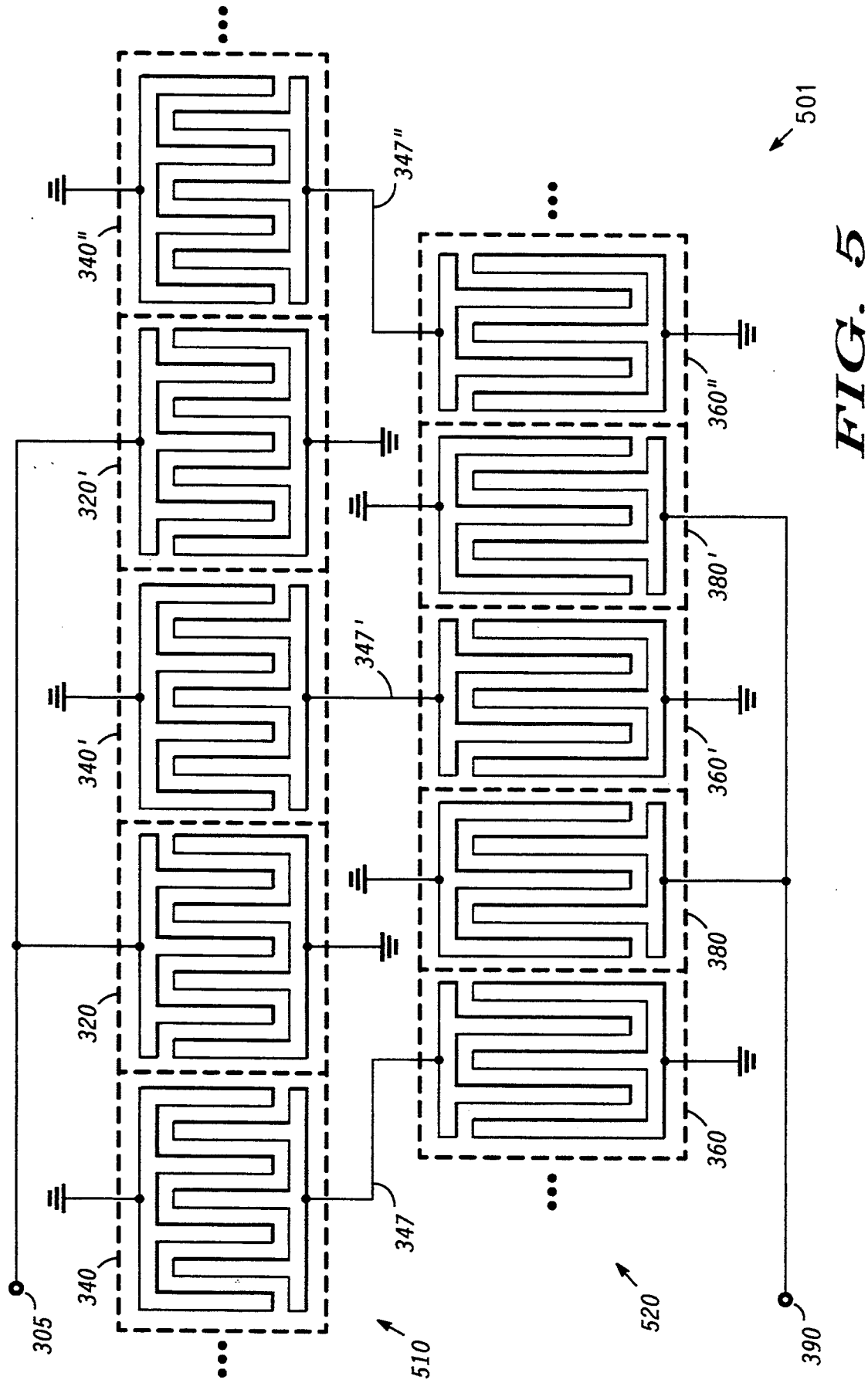
FIG. 5 is a simplified plan view of an acoustic wave filter in accordance with a second preferred embodiment of the present invention.

FIG. 5 is a simplified plan view of acoustic wave filter 501 in accordance with a second preferred embodiment of the present invention. Acoustic wave filter 501 comprises at least two acoustic tracks such as first acoustic track 510 and second acoustic track 520 wherein each acoustic track is analogous to cascaded multi-transducer filters as described, for example in "Acoustic Surface-Wave Bandpass Filter" M. Hikita U.S. Pat. No. 4,492,940 (Jan. 8, 1985) and in "Surface Acoustic Wave Filter, Method and Apparatus", D. Allen, U.S. patent application No. 793,925 (filed Nov. 18, 1991).

Transducers 320, 320′, etc. of first acoustic track 510 are electrically coupled to input 305 and are acoustically coupled to inductive transducers 340, 340′, 340″, etc. Inductive transducers 340, 340′, 340″, etc. have electrical connections 347, 347′, 347″, etc. coupled to capacitive transducers 360, 360′, 360″, etc., respectively, of second acoustic track 520. Capacitive transducers 360, 360′, 360″, etc. are acoustically coupled to transducers 380, 380′, etc. of second acoustic track 520, and transducers 380, 380′, etc. are electrically coupled to output 390.

In an alternative embodiment of the present invention, one or more inductive transducers (e.g., 340) may be electrically coupled to a plurality of capacitive transducers (e.g., 360, 360′, etc.), or a plurality of inductive transducers (e.g., 340, 340′, etc.) may be electrically coupled to one or more capacitive transducers (e.g., 360), provided that the total admittance of the plurality of capacitive transducer(s) and the total admittance of the plurality of inductive transducer(s) which are electrically coupled together is substantially in accordance with Eqs. (2) through (9).

Figure 6:
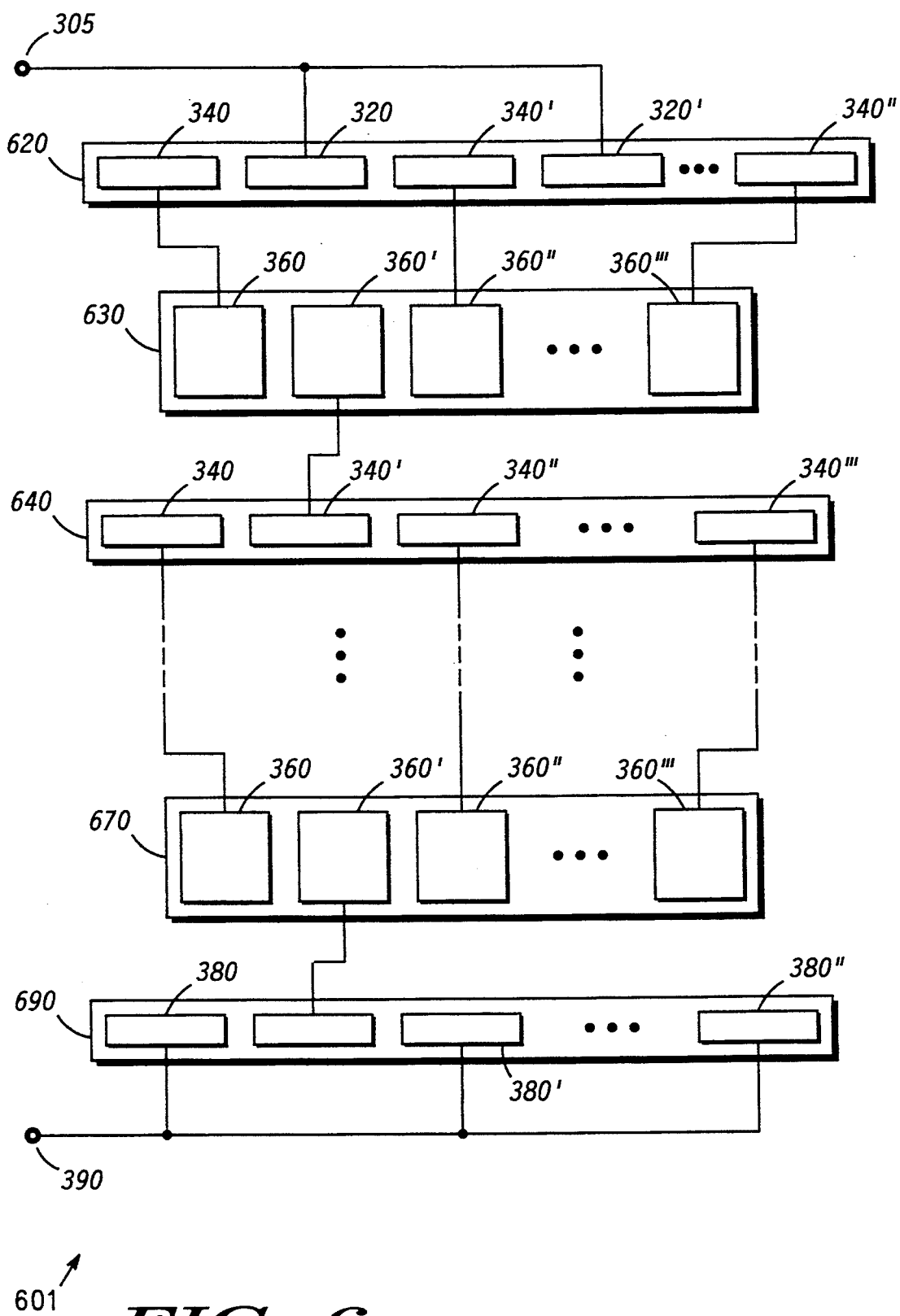
FIG. 6 is a simplified block diagram of an acoustic wave filter in accordance with a third preferred embodiment of the present invention.

FIG. 6 is a simplified block diagram of acoustic wave filter 601 in accordance with a third preferred embodiment of the present invention. Acoustic wave filter 601 comprises a plurality of acoustic tracks such as input acoustic track 620 coupled to input 305, intermediary acoustic tracks 630 . . . 670 and output acoustic track 690 electrically coupled to output 390. Input acoustic track 620 is analogous to acoustic track 510 (FIG. 5) whilst output acoustic track 690 is analogous to output acoustic track 520 (FIG. 5). Intermediary acoustic tracks 630 . . . 670 may each comprise (i) inductive transducers (e.g., 340, FIG. 3) each electrically coupled to a capacitive transducer (e.g., 360, FIG. 3) in an adjacent acoustic track and/or (ii) capacitive transducers (e.g., 360, FIG. 3) each electrically coupled to an inductive transducer (e.g., 340, FIG. 3) in an adjacent acoustic track. The arrangement of FIG. 6 may be employed to realize low passband insertion loss together with large out-of-band signal rejection and is well suited to handling of higher power signals, for example.

EXAMPLE

Figure 7:
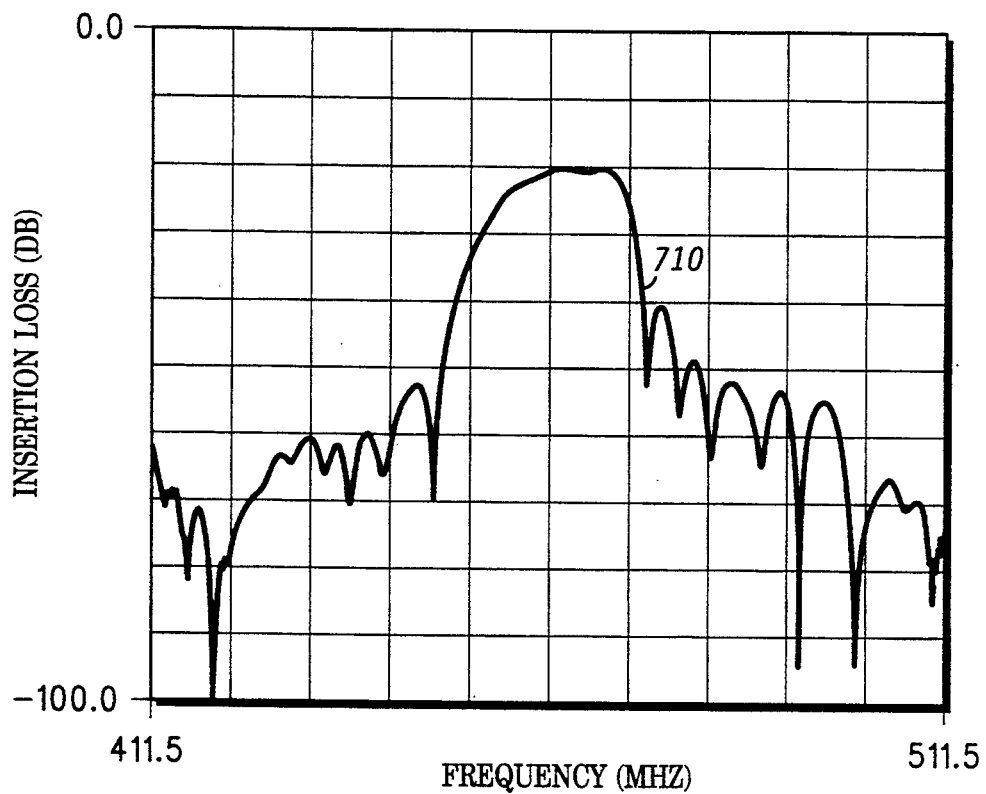
FIG. 7 is a graph of an experimentally measured transfer function versus frequency for a filter constructed in accordance with the present invention.
Figure 8:
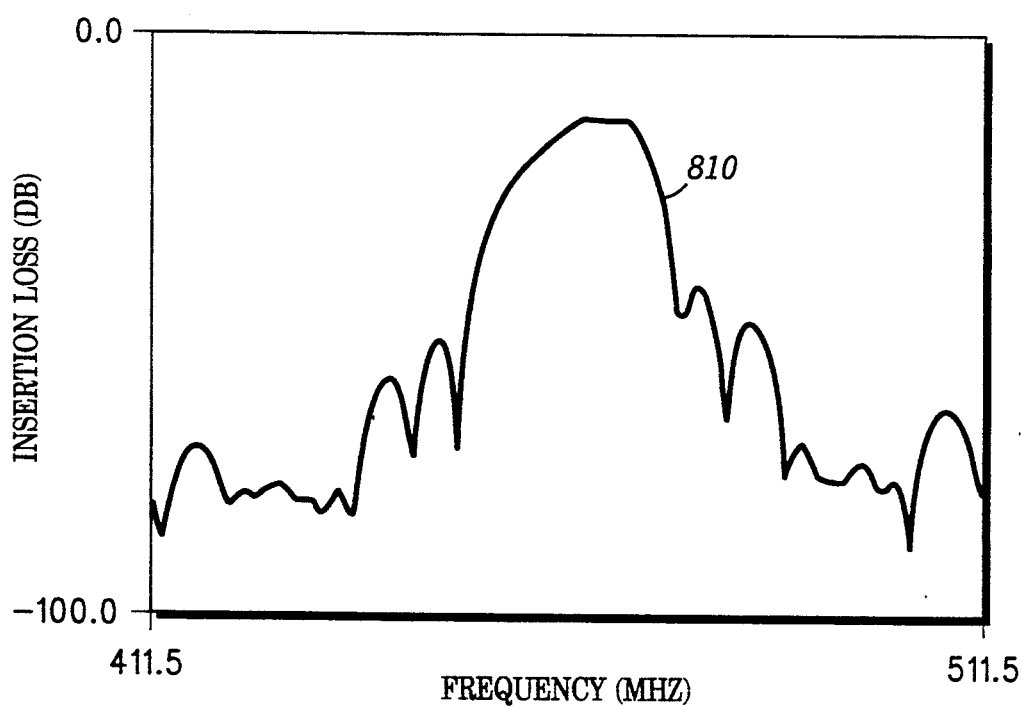
FIG. 8 is a graph of a simulated transfer function of the experimental device of FIG. 7.
Figure 9:
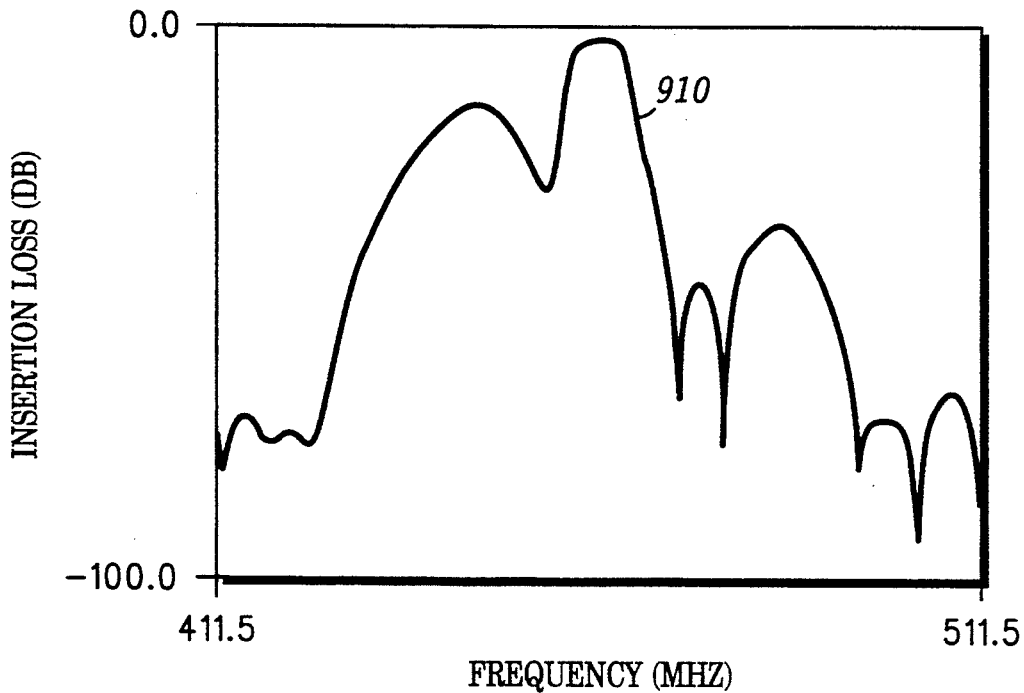
FIG. 9 is a graph of a simulated transfer function of a low insertion loss filter of the preferred embodiment of FIG. 3 for application in the receiver portion of the candidate radio of FIG. 10.

FIG. 7 is a graph of an experimentally measured transfer function 710 in deciBells versus frequency in megahertz for a filter constructed in accordance with the present invention. FIG. 8 is a graph of simulated transfer function 810 for the experimental device of FIG. 7 and FIG. 9 is a graph of simulated transfer function 910 for a low insertion loss filter of the preferred embodiment of FIG. 3 for application in the receiver portion of the candidate radio of FIG. 10 (infra). The ordinates of FIGS. 7 through 9 represent insertion loss and are calibrated from 0 dB (top) to −100 dB (bottom) while the abscissas are calibrated in MegaHertz over the range 411.5 MHz (left) to 511.5 MHz (right).

Referring now to experimentally measured transfer function 710 of FIG. 7, the filter was not optimized and corresponds to input 305, transducer 320, inductive transducer 340, capacitive transducer 360, transducer 380 and output 390 of FIG. 3, for example, wherein inductive transducer 340 and capacitive transducer 360 are designed in accordance with the parameters shown in Table III below. Experimentally measured transfer function 710 corresponds to insertion loss measured between input 305 and output 390. In this case, the experiment was performed prior to knowing optimum values (of length N and beamwidth A, for example) for conjugate matching, however, the concept was illustrated. For this design, the substrate material employed was 128° Y-rotated X-propagating lithium niobate. The apertures A and lengths N for input transducer 310, inductive transducer 340, capacitive transducer 360 and output transducer 370 are noted in Table III below.

| Parameter | Input Transducer | Inductive Transducer | Capacitive Transducer | Output Transducer |
| --- | --- | --- | --- | --- |
| Length (N) | 15 | 25 | 35 | 15 |
| Aperture (A) | 36 | 36 | 36 | 36 |

Table III. Transducer lengths in wavelengths for the device providing experimentally measured transfer function 710 (FIG. 7) and simulated transfer function 810 (FIG. 8). All transducers have three electrodes per wavelength.

Experimentally measured transfer function 710 has a center frequency of 468 megahertz, representing a relative frequency shift of 1.4% from the nominal center frequency $f_o$ design value, shows a nominal 3 dB bandwidth of about 11 megahertz or 2.4% and has approximately 3 dB of passband insertion loss due to combined effects of input and output port impedance mismatch, metallization resistance, matching component Q and acoustic propagation loss. A further 12 dB of insertion loss results from bidirectional loss from each of transducers 310, 340, 360, 370. These results were closely predicted by a comprehensive simulation as seen from comparison of experimentally measured transfer function 710 (FIG. 7) with simulated transfer function 810 (FIG. 8).

Figure 10:
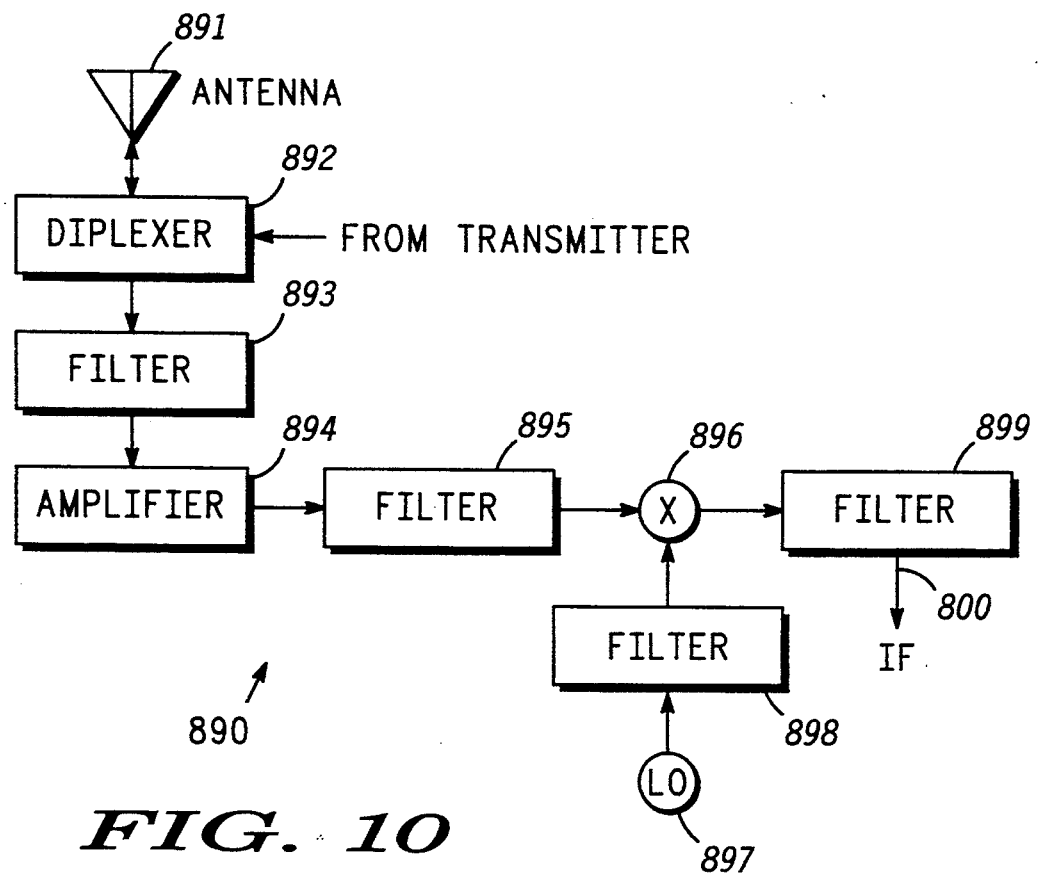
FIG. 10 shows a simplified schematic diagram of a portion of a radio employing multiple filters, as for example, one or more acoustic filters according to the present invention.

FIG. 10 is a simplified schematic diagram indicating how the above-described acoustic filters according to the present invention are advantageously used in radio circuit 890. Radio circuit 890 comprises antenna 891 sending or receiving signals from optional diplexer 892 (which is coupled to the transmitter if one is used).

Diplexer 892 sends an incoming signal to filter 893 which passes the resulting band limited signal to amplifier 894. From amplifier 894 the signal passes through another band limiting filter 895 to mixer 896. Mixer 896 also receives a signal from local oscillator 897 through band limiting filter 898. The mixed signal from mixer 896 passes through band limiting filter 899 which removes the local oscillator signal and sends the result to the receiver IF via output 800.

Diplexer 892 and filters 893, 895, 898 and/or 899 are advantageously acoustic filters of the type described here and made according to the structure and method of the present invention, but of varying frequency, insertion loss, passband width, rejection stopband depth and/or width or other properties according to the particular desired function. For example, filter 893 removes input RF frequencies outside the band in which the receiver is intended to operate. This is particularly useful for narrow band receivers such as are frequently required in cellular phone and paging applications and the like.

Referring now to FIG. 9, simulated transfer function 910 is an example of a filter response (e.g., filter 893, FIG. 10) designed in accordance with the present invention using the embodiment of FIG. 3. The primary requirements for this filter are (1) to pass a band of frequencies from 458.5 to 464.5 MHz with low insertion loss and (2) to reject the transmitter band of frequencies from 471.5 to 477.5 MHz a minimum of 40 dB with respect to the passband insertion loss. The filter was designed for a 64° Y-rotated, X-propagating lithium niobate substrate. No matching elements were required between the two acoustic tracks in order to achieve the minimum passband insertion loss of 1.5 dB.

Filter 895 may have the same or a different pass band than filter 893 and removes any undesired harmonics generated by amplifier 894 or other out-of-band signals not removed by filter 893. Filter 898 desirably passes the LO frequency and stops undesired harmonics thereof. Filter 899 desirably passes the sum or difference frequencies produced by mixer 896, and blocks the local oscillator and input RF frequencies. This is important to avoid saturating the input stages of the IF amplifier which is typically coupled to output 800. Thus, electronic apparatus, and especially radios, have improved properties as a result of the improved properties of the acoustic filters of the present invention.

The above-described filters are constructed by a method comprising, in a first embodiment, providing a substrate for propagating acoustic waves and providing on the substrate at least an input and an output filter each comprising a plurality of acoustic transducers, wherein at least one transducer of one filter is electrically coupled to at least one transducer of the other filter and the two at least one transducers have electrical impedances which are conjugately matched to within a desired degree. Lithium niobate, quartz and lithium tantalate are examples of suitable substrate materials, with the lithium compounds being preferred.

The transducers are formed by depositing a conductive film, usually a metal such as aluminum, on the substrate. By means of photoresist-dispensing, baking, photo-masking and etching steps well known in the art, the unwanted portions of the metal film are removed, for example. Other techniques (e.g., photo- and/or pyro-lytic deposition of metal, liftoff, etc.) are also suitable for providing patterned films suitable for use as transducers.

Deposition of conductive films may be carried out by vacuum evaporation, sputtering, etc., as are well known in the art. Filters intended for high power applications (e.g., filter 892, FIG. 10) may employ metals adapted for that application, as described, for example, in "Electrode Material For Surface Acoustic Wave Devices And Surface Acoustic Wave Device Using The Same", H. Kojima et al., U.S. Pat. No. 4,906,885 (Mar. 6, 1990), which is hereby incorporated herein by reference.

These metallization, masking and etching steps are conventional and well known in the art. What is different is the shape of the electrode pattern formed in the film. This is accomplished by providing an etch having an image of the electrode shape and arrangement described herein. Additional details regarding radio design and construction may be found in a variety of textbooks, patents and other publications, including the Amateur Radio Relay League Handbook, available from the American Radio Relay League, Newington, Conn., and Reference Data for Radio Engineers, Fifth Edition, Howard W. Sams & Co., New York (1968).

Thus, a method and apparatus for improved acoustic wave filters have been described overcoming specific problems and accomplishes certain advantages relative to prior art methods and mechanisms. The improvements over known technology are significant. The expense, complexities, and high parts count of prior art filters are avoided without sacrifice of performance characteristics or compromise of manufacturability.

Similarly, the expense, size, weight and labor associated with external matching components are obviated, while maintaining the low passband insertion loss, good shape factor and stopband rejection characteristics associated with cascaded filters. Greater design flexibility is also provided when compared to prior art approaches.

Specifically, the advantage of providing intrinsic impedance matching between two transducers is retained while allowing each of the two conjugately matched transducers to have distinct null frequencies which may be selectively placed to improve stopband performance.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

I claim:

1. A method for forming a filter, the method comprising steps of:
   (a) providing an acoustic wave propagating substrate having an effective coupling coefficient $k^2$;
   (b) disposing a first electro-acoustic transducer on the acoustic wave propagating substrate;
   (c) disposing a first acousto-electric transducer having a length $M_1$ on the acoustic wave propagating substrate, the first acousto-electric transducer having $N_1$ many electrode pairs therein, wherein $N_1 \geq C/k^2$, C being a constant having a value in the range from 1 to 2, the first acousto-electric transducer being acoustically coupled to the first electro-acoustic transducer;

(d) disposing a second acousto-electric transducer on the acoustic wave propagating substrate; and (e) disposing a second electro-acoustic transducer having a length $M_2$ on the acoustic wave propagating substrate, wherein $M_2$ is more than $M_1$, the second electro-acoustic transducer being electrically coupled and conjugately impedance matched to the first acousto-electric transducer, the second electro-acoustic transducer having $N_2$ many electrode pairs therein, wherein $N_2 < N_1$, the second electro-acoustic transducer being acoustically coupled to the second acousto-electric transducer.

2. A method as claimed in claim 1, wherein said step (e) further includes a step of disposing a second electro-acoustic transducer having $N_2$ many electrode pairs on the acoustic wave propagating substrate, wherein $N_2 < C/k^2$.

3. A method for forming a filter, the method comprising steps of:

(a) providing an acoustic wave propagating substrate having an effective coupling coefficient $k^2$;

(b) disposing a first electro-acoustic transducer on the acoustic wave propagating substrate;

(c) disposing a first acousto-electric transducer having a first electrical admittance $Y_1 = G_1 + jX_1$ on the acoustic wave propagating substrate, wherein $G_1$ is a first real conductance and $X_1$ is a first imaginary conductance, the first imaginary conductance $X_1$ having a negative value over at least a first frequency range, the first acousto-electric transducer having $N_1$ many electrode pairs therein, wherein $N_1 \geq C/k^2$, C being a constant having a value in the range from 1 to 2, the first acousto-electric transducer being acoustically coupled to the first elector-acoustic transducer;

(d) disposing a second acousto-electric transducer on the acoustic wave propagating substrate; and (e) disposing a second electro-acoustic transducer having a second electrical admittance $Y_2 = G_2 + jX_2$ on the acoustic wave propagating substrate, wherein $G_2$ is a second real conductance and $X_2$ is a second imaginary conductance, the second imaginary conductance $X_2$ having a positive value over at least the first frequency range, wherein the first and second real conductances $G_1$ and $G_2$ are approximately equal over the first frequency range and wherein magnitudes of the first and second imaginary conductances $X_1$ and $X_2$ are approximately equal over the first frequency range, the second electro-acoustic transducer being electrically coupled and conjugately impedance matched to the first acousto-electric transducer, the second electro-acoustic transducer having $N_2$ many electrode pairs therein, wherein $N_2 < N_1$, the second electro-acoustic transducer being acoustically coupled to the second acousto-electric transducer.

4. A filter device comprising:

(a) an acoustic wave propagating substrate having an effective coupling coefficient $k^2$;

(b) a first filter comprising:

(b1) a first electro-acoustic transducer disposed on said acoustic wave propagating substrate, said first electro-acoustic transducer for converting a first electric signal into a first acoustic signal; and (b2) a first acousto-electric transducer disposed on said acoustic wave propagating substrate, said first acousto-electric transducer for converting said first acoustic signal into a second electric signal, said first acousto-electric transducer having $N_1$ many electrode pairs therein, wherein $N_1 \geq C/k^2$, C being a constant having a value in a range from 1 to 2, said first acousto-electric transducer being acoustically coupled to said first electro-acoustic transducer, wherein said first acousto-electric transducer has a first electrical admittance $Y_1 = G_1 + jX_1$, wherein $G_1$ is a first real conductance and $X_1$ is a first imaginary conductance, said first imaginary conductance $X_1$ having a negative value over at least a first frequency range; and (c) a second filter comprising:

(c1) a second electro-acoustic transducer disposed on said acoustic wave propagating substrate, said second electro-acoustic transducer being electrically coupled to said first acousto-electric transducer, said second electro-acoustic transducer for converting said second electric signal to a second acoustic signal, said second electro-acoustic transducer having $N_2$ many electrode pairs therein, wherein $N_2 < N_1$, wherein said second electro-acoustic transducer has a second electrical admittance $Y_2 = G_2 + jX_2$, wherein $G_2$ is a second real conductance and $X_2$ is a second imaginary conductance, said second imaginary conductance $X_2$ having a positive value over at least said first frequency range; and (c2) a second acousto-electric transducer disposed on said acoustic wave propagating substrate, said second electro-acoustic transducer being acoustically coupled to said second acousto-electric transducer, said second acousto-electric transducer for converting said second acoustic signal to a third electrical signal, said third electrical signal corresponding to a filtered and delayed version of said first electrical signal.

5. A filter device as claimed in claim 4, wherein $N_2 < C/k^2$.

6. A filter including in combination:

a substrate for propagating acoustic waves;

a first electro-acoustic transducer disposed on said substrate, said first electro-acoustic transducer for generating first acoustic waves in response to a first electrical signal applied to said first electro-acoustic transducer;

a first inductive acoustic transducer disposed on said substrate, said first inductive acoustic transducer acoustically coupled to said first electro-acoustic transducer, said first inductive acoustic transducer having a first electrical admittance $Y_1 = G_1 + jX_1$, wherein $G_1$ is a first real conductance and $X_1$ is a first imaginary conductance, said first imaginary conductance $X_1$ having a negative value over at least a first frequency range, said first inductive acoustic transducer for generating a second electrical signal in response to said first acoustic waves;

a first capacitive acoustic transducer disposed on said substrate, said first capacitive acoustic transducer electrically coupled to said first inductive acoustic transducer, said first capacitive acoustic transducer having a second electrical admittance $Y_2 = G_2 + jX_2$, wherein $G_2$ is a second real conductance and $X_2$ is a second imaginary conductance, said second imaginary conductance $X_2$ having a positive value over at least said first frequency range, said first capacitive acoustic transducer for generating second acoustic waves in response to said second electrical signal;

a first acousto-electric transducer disposed on said substrate, said first acousto-electric transducer acoustically coupled to said first capacitive acoustic transducer, said first acousto-electric transducer for generating a third electrical signal in response to said second acoustic waves, said third electrical signal providing a filtered version of said first electrical signal;

wherein said first and second real conductances $G_1$ and $G_2$ are approximately equal over said first frequency range; and wherein magnitudes of said first and second imaginary conductances $X_1$ and $X_2$ are approximately equal over said first frequency range.

7. A filter as claimed in claim 6, wherein said first inductive acoustic transducer has $N_1$ many electrode pairs therein, wherein $N_1 \geq C/k^2$, C is a constant having a value in a range from 1 to 2 and wherein $k^2$ is an effective coupling coefficient of said substrate.

8. A filter as claimed in claim 7, wherein said first capacitive acoustic transducer has $N_2$ many electrode pairs therein, wherein $N_2$ is less than $N_1$.

9. A filter as claimed in claim 7, wherein said first capacitive acoustic transducer has $N_2$ many electrode pairs therein, wherein $N_2$ is less than $C/k^2$.

10. A filter as claimed in claim 6, wherein said first and said second electrical admittances substantially obey a relation:

$$|Y_2^* - Y_1|/|Y_2^* + Y_1| < \delta,$$

wherein $\delta$ is a parameter describing admittance mismatch between said first inductive acoustic transducer and said first capacitive acoustic transducer.

11. A filter as claimed in claim 10, wherein $\delta$ is less than 0.33.

12. A filter device comprising:
(a) an acoustic wave propagating substrate having an effective coupling coefficient $k^2$;
(b) a first filter comprising:
   (b1) a first electro-acoustic transducer disposed on said acoustic wave propagating substrate; and
   (b2) a first acousto-electric transducer disposed on said acoustic wave propagating substrate, said first acousto-electric transducer having a first electrical admittance $Y_1 = G_1 + jX_1$, wherein $G_1$ is a first real conductance and $X_1$ is a first imaginary conductance, said first imaginary conductance $X_1$ having a negative value over at least a first frequency range, said first acousto-electric transducer being acoustically coupled to said first electro-acoustic transducer; and
(c) a second filter comprising:
   (c1) a second acousto-electric transducer disposed on said acoustic wave propagating substrate; and
   (c2) a second electro-acoustic transducer disposed on said acoustic wave propagating substrate, said second electro-acoustic transducer being electrically coupled to said first acousto-electric transducer, said second electro-acoustic transducer having a second electrical admittance $Y_2 = G_2 + jX_2$, wherein $G_2$ is a second real conductance and $X_2$ is a second imaginary conductance, said second imaginary conductance $X_2$ having a positive value over at least said first frequency range, said second electro-acoustic transducer being acoustically coupled to said second acousto-electric transducer; and wherein said first and said second electrical admittances substantially obey a relation:

$$|Y_2^* - Y_1|/|Y_2^* + Y_1| < \delta,$$

wherein $\delta$ is a parameter describing admittance mismatch between said first acousto-electric transducer and said second electro-acoustic transducer.

13. A filter device as claimed in claim 12, wherein $\delta$ is less than 0.1.

14. A filter device as claimed in claim 12, wherein $\delta$ is less than 0.33.

15. A filter device as claimed in claim 12, wherein said first acousto-electric transducer has $N_1$ many electrode pairs therein, wherein $N_1 \geq C/k^2$, C being a constant having a value in a range from 1 to 2.

16. In a radio frequency apparatus, a filter comprising:
(a) an acoustic wave propagating substrate having an effective coupling coefficient $k^2$;
(b) a first filter comprising:
   (b1) a first electro-acoustic transducer disposed on said acoustic wave propagating substrate; and
   (b2) a first acousto-electric transducer disposed on said acoustic wave propagating substrate, said first acousto-electric transducer having $N_1$ many electrode pairs therein, wherein $N_1 \geq C/k^2$, C being a constant having a value in a range from 1 to 2, said first acousto-electric transducer being acoustically coupled to said first electro-acoustic transducer, wherein said first acousto-electric transducer has a first electrical admittance $Y_1 = G_1 + jX_1$, wherein $G_1$ is a first real conductance and $X_1$ is a first imaginary conductance, said first imaginary conductance $X_1$ having a negative value over at least a first frequency range; and
(c) a second filter comprising:
   (c1) a second acousto-electric transducer disposed on said acoustic wave propagating substrate; and
   (c2) a second electro-acoustic transducer disposed on said acoustic wave propagating substrate, said second electro-acoustic transducer being electrically coupled to said first acousto-electric transducer, said second electro-acoustic transducer having $N_2$ many electrode pairs therein, wherein $N_2 < N_1$, said second electro-acoustic transducer being acoustically coupled to said second acousto-electric transducer, wherein said second electro-acoustic transducer has a second electrical admittance $Y_2 = G_2 + jX_2$, wherein $G_2$ is a second real conductance and $X_2$ is a second imaginary conductance, said second imaginary conductance $X_2$ having a positive value over at least said first frequency range;

wherein said first and second real conductances $G_1$ and $G_2$ are approximately equal over said first frequency range; and wherein magnitudes of said first and second imaginary conductances $X_1$ and $X_2$ are approximately equal over said first frequency range.

17. A radio frequency apparatus as claimed in claim 16, wherein said first and said second electrical admittances substantially obey a relation:

$$|Y_2^* - Y_1|/|Y_2^* + Y_1| < \delta,$$

wherein $\delta$ is a parameter describing admittance mismatch between said first acousto-electric transducer and said second electro-acoustic transducer.

* * * * *